United States Patent [19]

Betzold

[11] Patent Number: 4,563,597
[45] Date of Patent: Jan. 7, 1986

[54] ACCURATE DEAD BAND CONTROL CIRCUIT

[75] Inventor: Robert A. Betzold, Hennepin, Minn.

[73] Assignee: Honeywell Inc., Minneapolis, Minn.

[21] Appl. No.: 443,792

[22] Filed: Nov. 22, 1982

[51] Int. Cl.[4] .................. H03K 5/153; H03K 17/62; H03F 3/45

[52] U.S. Cl. .................. 307/360; 307/494; 307/355; 307/299 A; 330/252

[58] Field of Search .............. 307/299 A, 490, 494, 307/360, 364, 350, 355, 354, 351, 231; 330/252; 357/36

[56] References Cited

U.S. PATENT DOCUMENTS

| | | | |
|---|---|---|---|
| 3,700,921 | 10/1972 | Gay | 307/235 |
| 3,716,726 | 2/1973 | Trimble | 307/549 |
| 3,851,259 | 11/1974 | Porawski | 328/143 |
| 3,916,328 | 10/1975 | Wilson | 328/150 |
| 3,918,004 | 11/1975 | Shimizu et al. | 330/30 D |
| 4,061,932 | 12/1977 | Cordell | 307/360 |
| 4,072,870 | 2/1978 | Davis | 307/350 |
| 4,132,909 | 1/1979 | Nutz | 307/354 |
| 4,184,087 | 1/1980 | Nutz | 307/360 |
| 4,277,695 | 7/1981 | Wilber et al. | 307/542 |
| 4,292,552 | 9/1981 | Tanaka | 307/354 |
| 4,300,063 | 11/1981 | Dunphy et al. | 307/355 |
| 4,348,602 | 9/1982 | Sauer | 307/530 |

Primary Examiner—Larry N. Anagnos
Assistant Examiner—Richard Roseen
Attorney, Agent, or Firm—Alfred N. Feldman

[57] ABSTRACT

Two pairs of solid state current path means, disclosed as transistors, are interconnected to provide an accurate dead band control circuit means. The transistors have emitters that are intentionally mismatched in size thereby creating dissimilar current conducting characteristics for each pair of transistors. The switching characteristics of each pair of transistors can be controlled by the areas of the emitters and thereby a dead band can be created between the two pairs of transistors which can be used as an accurate dead band control.

7 Claims, 2 Drawing Figures

ACCURATE DEAD BAND CONTROL CIRCUIT

BACKGROUND OF THE INVENTION

Various types of control systems have for many years used dead bands in their operation. A dead band normally is defined as the range of values of a measured variable to which an instrument or system will not effectively respond.

The use of dead bands can be applied to many types of instruments or systems, but is particularly of value in the heating and cooling control art. Ordinarily a dead band will exist between the operation of a heating or cooling function, or will be present between directions of rotation or movement of an electromechanical device, such as a motor, in the positioning of some element in a heating or cooling system.

Typically dead bands have been provided in electronic systems by the use of operational amplifiers, bridges, and resistances to establish bridge control values. When this type of an arrangement is used the width of the dead band is sometimes quite critical. A narrow dead band is more sensitive to electronic noise, whereas a wide dead band reduces the resolution of the control system. Presently this type of dead band characteristic is generated by using operational amplifiers with external resistors which may, in some cases, require trimming. This type of a system is quite expensive to manufacture and accurately control.

SUMMARY OF THE INVENTION

The present invention is directed to an accurate type of dead band control that is particularly adapted for integrated circuit, on-chip design. The present invention utilizes four transistors that are operated as pairs. The transistors have emitter areas that are intentionally mismatched so that each pair of transistors contains a mismatched difference in areas of the emitters so that each of the transistors in the pair is capable of carrying a different amount of current. By operating each pair of transistors from a voltage source means, and sinking their emitter currents through a current source means, it is possible to get accurately controlled voltage-current characteristics for each pair of transistors. If the transistors are differentially controlled, this difference generates a well-defined dead band characteristic. This characteristic can be controlled in its width by the design of the emitter areas of the four transistors.

This same type of structure could be accomplished in discrete form by the proper selection of transistors, but is most readily accomplished where all four transistors are designed and fabricated as part of the same integrated circuit. This allows for matching saturation currents, accurate control of the emitter areas, and provides all four transistors with a common environment so that temperature variations between the elements are kept to an absolute minimum.

DESCRIPTION OF THE PREFERRED EMBODIMENT

Figure 1:
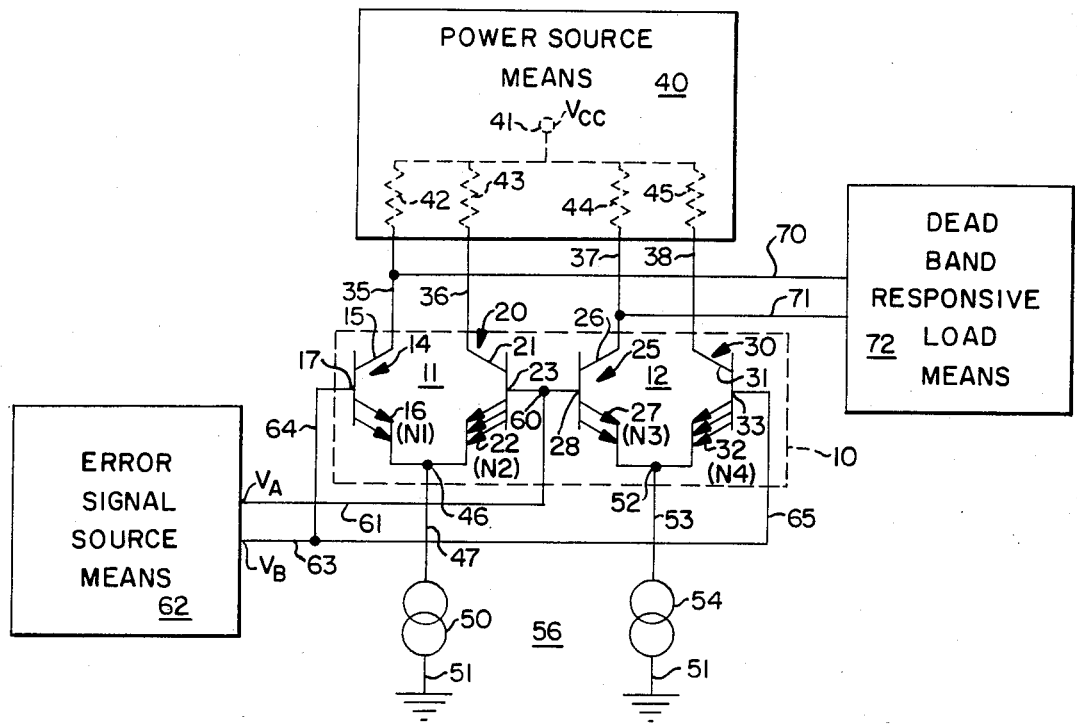
FIG. 1 is a schematic representation of an accurate on-chip type of dead band circuit.

A circuit means 10 having an accurately controlled dead band characteristic is disclosed. The circuit means 10 could be fabricated by the use of discrete components or can be fabricated as an integrated circuit. Regardless of which way the circuit means 10 is developed, its characteristics and operation would be the same. In the balance of the discussion of the disclosure, the circuit elements will be referred to as discrete or individual elements for convenience.

The circuit means 10 contains two pairs of solid state current path means specifically disclosed as transistors. The first pair of solid state current path means 11 includes a first transistor 14 having a collector 15, emitter 16, and a base 17 that forms an input control means for the solid state current path means 14. The transistor emitter 16 is disclosed as a dual emitter to represent an emitter area and has a defined area. This area allows the transistor 14 to have a particular current carrying or conducting characteristic. A second transistor 20 of the first pair of solid state current path means 11 includes a collector 21, emitter 22 and a base 23. In the transistor 20, the emitter 22 is disclosed as being greater in area than the emitter 16 of transistor 14.

The second pair of solid state current path means 12 are made up of two transistors 25 and 30 that are comparable to the transistors 14 and 20. The transistor 25 has a collector 26, emitter 27, and a base or input control means 28. The transistor 30 has a collector 31, emitter 32, and a base or input control means 33. Once again the emitter 27 and 32 are of different areas thereby creating dissimilar current conducting characteristics for the current path means 12, as was done with 11. The emitters 16, 22, 27 and 32 have been identified as N1, N2, N3, and N4 for convenience in developing an equation later in the text that helps explain the operation of the novel device. Emitters 16 (N1) and 27 (N3) are generally equal in effective areas, while emitters 22 (N2) and 32 (N4) are generally equal in effective areas, but are larger than the areas off emitters 16 and 27.

The collectors 15, 21, 26, and 31 each have connection means disclosed at 35, 36, 37, and 38 which are adapted to connect the two pairs of solid state current path means 11 and 12 to a power source means generally disclosed at 40. The power source means 40 would typically include a source of voltage 41 and a series of impedances 42, 43, 44, and 45 that individually connect the voltage at 41 to the connection means 35, 36, 37, and 38.

Each of the emitters 16 and 22 have a common connection at 46 that is adapted to be connected by conductor 47 to a current source disclosed at 50. The current source 50 is grounded at 51. The current source is a conventional current source which causes the current conducted by the transistors 14 and 20 to properly divide. The transistors 25 and 30 are connected at their emitters 27 and 32 at 52 to a conductor or connection means 53 which in turn is adapted to be connected to a further current source 54 and the ground 51. The two current sources 50 and 54 make up a current source means 56 necessary for the operation of the novel circuit means 10.

The bases 23 and 28 of the transistors 20 and 25 are connected at 60 and have an input means 61 that is connected to an error signal source means 62. The voltage on the conductor 61 is referenced as voltage $V_A$. The error signal source means 62 can be any convenient signal source means such as a bridge, a potentiometer operating as a variable voltage divider, etc., and the only requirement is that the voltage on the conductor 61 be variable with respect to a voltage on a further conductor 63 that has been identified as voltage $V_B$. The conductor 63 is connected by a conductor 64 to the base 17 of the transistor 14, and by a conductor 65 to the base 33 of the transistor 31.

It will be noted that the base 17 of transistor 14 is therefore directly connected to the base 33 of the transistor 31, thereby connecting transistors which have dissimilar current conducting characteristics. The bases 23 and 28 of the transistors 20 and 25 are directly connected at the junction 60, and therefore interconnect the other two transistors 20 and 25 so that they are in turn connected to transistors having dissimilar current conducting characteristics. In effect the two pairs of solid state current path means or transistors 11 and 12 are differentially connected.

The circuit is completed by connection means 70 and 71 between the connection means 35 and 37 wherein an output having a dead band differential can be utilized. A difference in voltage occurs on the conductors 70 and 71, as will be developed in the discussion of the operation of the circuit, and are used or adapted to be connected to a dead band responsive load means 72. The dead band responsive load means 72 could be any type of load that operates in response to the error signal source means 62. Typically the dead band responsive load means would be a bidirectional motor which has a finite dead band in determining which direction the motor should be operating with respect to at any particular error signal source means level of voltage.

It should be noted that the power source means 40, the error signal source means 62, and the dead band responsive load means 72 can be any type of conventional components in a control system, and only some general description of the types have been made in order to show how the control circuit means 10 would be adapted to be connected into a control system.

Figure 2:
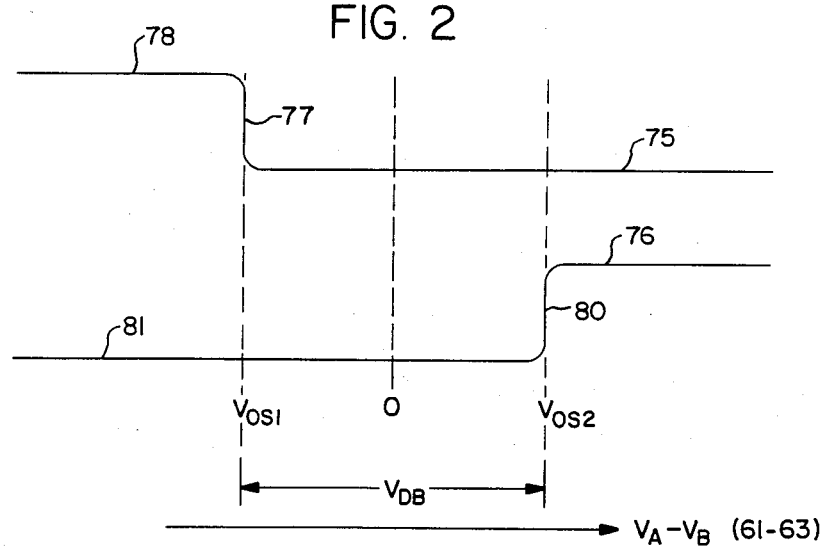
FIG. 2 are the voltage wave forms generating the accurate dead band.

In FIG. 2 there are disclosed voltage characteristics for the circuit means 10. The uppermost voltage characteristic 75 is a representation of the voltage that appears on conductor 70 as the voltage difference between the conductor 61 and 63 increases. The curve 76 is the voltage appearing on conductor 71 with the same voltage change between the conductor 61 and 63. It will be noted that the voltage wave form 75 decreases at 77 rather sharply from a maximum value at 78. The drop-off at 77 has been identified as voltage $V_{OS1}$. The voltage curve 76 is noted as rising sharply at 80 from a minimum value at 81 and the rise 80 is identified as $V_{OS2}$. The difference in the voltage drop at 77 and the rise at 80 is the voltage dead band which has been identified as $V_{DB}$. This voltage is the dead band voltage that appears between the conductors 70 and 71 to operate the dead band responsive load means 72.

The dead band voltage $V_{DB}$ is generated from the difference between the offset voltages $V_{OS1}$ and $V_{OS2}$ as shown in FIG. 2. Equations for the development of the dead band are disclosed, and it should be understood that the dead band voltage is a direct result of the design of the transistors 14, 20, 25, and 30 wherein the emitters 16, 22, 27, and 32 have been designed to provide dissimilar current conducting characteristics for the associated transistors. This could readily be accomplished by the use of different emitter areas. The equations for the development of the offset voltages $V_{OS1}$ and $V_{OS2}$ are as follows:

$$V_{OS1} = V_T \ln (N1/N2)$$

$$V_{OS2} = V_T \ln N4/N3$$

$$V_{DB} = V_{OS2} - V_{OS1} = V_T [Ln (N2N4/N1N3)]$$

WHERE $V_T = kT/q$.

$V_T$ is defined as the built-in potential across the junction of the transistors, k is Boltzmann's constant, T is degrees Kelvin, and q is the charge on an electron.

Using this geometrically controlled technique of sizing the emitters of transistors 14, 20, 25, and 30, dead bands can be generated in an on-chip configuration with tolerances better than plus or minus two millivolts, giving accurate dead bands without the need for external trim resistors. Also, positive feedback can be added (even though not shown) for snap action which would be independent of the dead band.

The present invention develops a very simple expedient for providing an accurately controlled dead band without the need for trimming resistors or matching components once an integrated circuit has been designed and built. While the present invention has been described and discussed as one in which integrated circuitry is used, it is possible to utilize the present invention by the use of discrete or individual components. The advantages of the integrated circuit are the consistency and the elimination of temperature differences between the components, but by proper selection of the transistors in discrete form, the solid state current path means having dissimilar current conducting characteristics can readily be obtained. Since the present invention is subject to application in various forms, the applicant wishes to be limited in the scope of his invention solely by the scope of the appended claims.

The embodiments of the invention in which an exclusive property or right is claimed are defined as follows:

1. A circuit means having a controlled dead band voltage characteristic, including: a first pair of solid state current path means having selectable internal dissimilar current conducting characteristics to conduct separate currents of different magnitudes with each of said path means including input control means; said pair of current path means adapted to be connected between voltage source means and current source means to conduct separate currents of different magnitudes through each of said current path means; said input control means adapted to be connected to error signal source means to control current flows in said pair of solid state current path means; a second pair of solid state current path means having selectable internal dissimilar current conducting characteristics to conduct separate currents of different magnitudes with each of said second pair of current path means including input control means; said second pair of current path means adapted to be connected between said voltage source means, and said current source means to conduct separate currents of different magnitudes through each of said second current path means; said second input control means adapted to be connected to said error signal source means to control further current flows in said second pair of solid state current path means; a first of said input control means of said first pair of current path means connected to a first of said input means of said second pair of current path means; a second of said input control means of said first pair of current path means connected to a second of said input control means of said second pair of current path means; and output means connected between said first and said second pairs of said solid state current path means wherein said output means provides the controlled dead band voltage characteristic.

2. A circuit means having a controlled dead band as described in claim 1 wherein said pairs of said solid state current path means are transistors having emitters, collectors, and bases; and said input control means are said bases of said transistors with said emitters and collectors forming portions of said current path means.

3. A circuit means having a controlled dead band as described in claim 2 wherein said dissimilar current conducting characteristics are provided within said transistors by said emitters being of different current carrying capacities.

4. A circuit means having a controlled dead band as described in claim 3 wherein said transistors are part of an integrated circuit and said different current carrying capacities are provided by said emitters of said transistors having different areas.

5. A circuit means having a controlled dead band as described in claim 4 wherein each of said pairs of transistors having common emitter connection means with said emitter connection means each connected to a separate current source which are part of said current source means.

6. A circuit means having a controlled dead band as described in claim 5 wherein a base of said transistor having a smaller emitter area of said first pair of transistors being connected to a base of said transistor of said second pair of transistors having a larger emitter area; and a base of said transistor having the larger emitter area of said first pair of transistors being connected to a base of said transistor of said second of said pairs of transistors having a smaller emitter area.

7. A circuit means having a controlled dead band as described in claim 3 wherein a base of said transistor having a smaller emitter area of said first pair of transistors being connected to a base of said transistor of said second pair of transistors having a larger emitter area; and a base of said transistor having the larger emitter area of said first pair of transistors being connected to a base of said transistor of said second of said pairs of transistors having a smaller emitter area.

* * * * *